US010714464B2

(12) United States Patent
Pokhriyal et al.

(10) Patent No.: US 10,714,464 B2
(45) Date of Patent: Jul. 14, 2020

(54) METHOD OF SELECTIVELY TRANSFERRING LED DIE TO A BACKPLANE USING HEIGHT CONTROLLED BONDING STRUCTURES

(71) Applicant: GLO AB, Lund (SE)

(72) Inventors: Anusha Pokhriyal, Sunnyvale, CA (US); Sharon N. Farrens, Boise, ID (US); Timothy Gallagher, Pleasanton, CA (US)

(73) Assignee: GLO AB, Lund (SE)

( * ) Notice: Subject to any disclaimer, the term of this patent is extended or adjusted under 35 U.S.C. 154(b) by 338 days.

(21) Appl. No.: 15/432,216

(22) Filed: Feb. 14, 2017

(65) Prior Publication Data

US 2017/0236811 A1 Aug. 17, 2017

Related U.S. Application Data

(60) Provisional application No. 62/295,697, filed on Feb. 16, 2016.

(51) Int. Cl.
*H01L 25/00* (2006.01)
*H01L 21/67* (2006.01)
(Continued)

(52) U.S. Cl.
CPC ........ *H01L 25/50* (2013.01); *H01L 21/67144* (2013.01); *H01L 21/6835* (2013.01);
(Continued)

(58) Field of Classification Search
CPC ........... H01L 21/67144; H01L 21/6835; H01L 24/81; H01L 24/83; H01L 25/00; H01L 25/0753; H01L 25/167
See application file for complete search history.

(56) References Cited

U.S. PATENT DOCUMENTS

2009/0278142 A1 11/2009 Watanabe et al.
2010/0032793 A1* 2/2010 Guenard ............. H01L 21/6835
257/507
(Continued)

FOREIGN PATENT DOCUMENTS

JP 2006140398 A 6/2006
KR 100862543 A 10/2008
(Continued)

OTHER PUBLICATIONS

International Search Report and Written Opinion of the International Searching Authority for International Patent Application No. PCT/US2017/017830, dated May 23, 2017, 12 pages.
(Continued)

*Primary Examiner* — Lynne A Gurley
*Assistant Examiner* — Vernon P Webb
(74) *Attorney, Agent, or Firm* — The Marbury Law Group PLLC

(57) ABSTRACT

Selective transfer of dies including semiconductor devices to a target substrate can be performed employing local laser irradiation. Coining of at least one set of solder material portions can be employed to provide a planar surface-to-surface contact and to facilitate bonding of adjoining pairs of bond structures. Laser irradiation on the solder material portions can be employed to sequentially bond selected pairs of mated bonding structures, while preventing bonding of devices not to be transferred to the target substrate. Additional laser irradiation can be employed to selectively detach bonded devices, while not detaching devices that are not bonded to the target substrate. The transferred devices can be pressed against the target substrate during a second reflow process so that the top surfaces of the transferred devices can be coplanar. Wetting layers of different sizes can be
(Continued)

employed to provide a trapezoidal vertical cross-sectional profile for reflowed solder material portions.

15 Claims, 12 Drawing Sheets

(51) Int. Cl.
| | |
|---|---|
| *H01L 21/683* | (2006.01) |
| *H01L 25/16* | (2006.01) |
| *H01L 33/62* | (2010.01) |
| *H01L 25/075* | (2006.01) |
| *H01L 23/00* | (2006.01) |
| *H01L 33/00* | (2010.01) |

(52) U.S. Cl.
CPC .............. *H01L 24/81* (2013.01); *H01L 24/83* (2013.01); *H01L 25/167* (2013.01); *H01L 33/005* (2013.01); *H01L 33/62* (2013.01); H01L 25/0753 (2013.01); H01L 2221/68322 (2013.01); H01L 2221/68327 (2013.01); H01L 2221/68354 (2013.01); H01L 2221/68368 (2013.01); H01L 2221/68381 (2013.01); H01L 2224/81224 (2013.01); H01L 2224/81815 (2013.01); H01L 2224/83224 (2013.01); H01L 2224/83815 (2013.01); H01L 2933/0066 (2013.01)

(56) References Cited

U.S. PATENT DOCUMENTS

| | | | |
|---|---|---|---|
| 2010/0186883 A1* | 7/2010 | Tomoda | .............. H01L 25/0753 156/220 |
| 2015/0111329 A1 | 4/2015 | Wu et al. | |
| 2016/0093665 A1 | 3/2016 | Schubert et al. | |

FOREIGN PATENT DOCUMENTS

| | | |
|---|---|---|
| WO | WO2016022824 A1 | 2/2016 |
| WO | WO2016100657 A2 | 6/2016 |
| WO | WO2016100662 A1 | 6/2016 |

OTHER PUBLICATIONS

Thompson, D.B. et al., "Laser Lift-Off on Isolated Iii-Nitride Light Islands for Intersubstrate Led Transfer," U.S. Appl. No. 15/339,194, filed Oct. 31, 2016, 242 pages.

Jansen, M. et al., "Led Backlight Unit With Separately and Independently Dimmable Zones for A Liquid Crystal Display," U.S. Appl. No. 15/429,338, filed Feb. 10, 2017, 74 pages.

International Preliminary Report on Patentability and Written Opinion of the International Searching Authority from International Bureau for International Patent Application No. PCT/US2017/017830, dated Aug. 30, 2018, 12 pages.

* cited by examiner

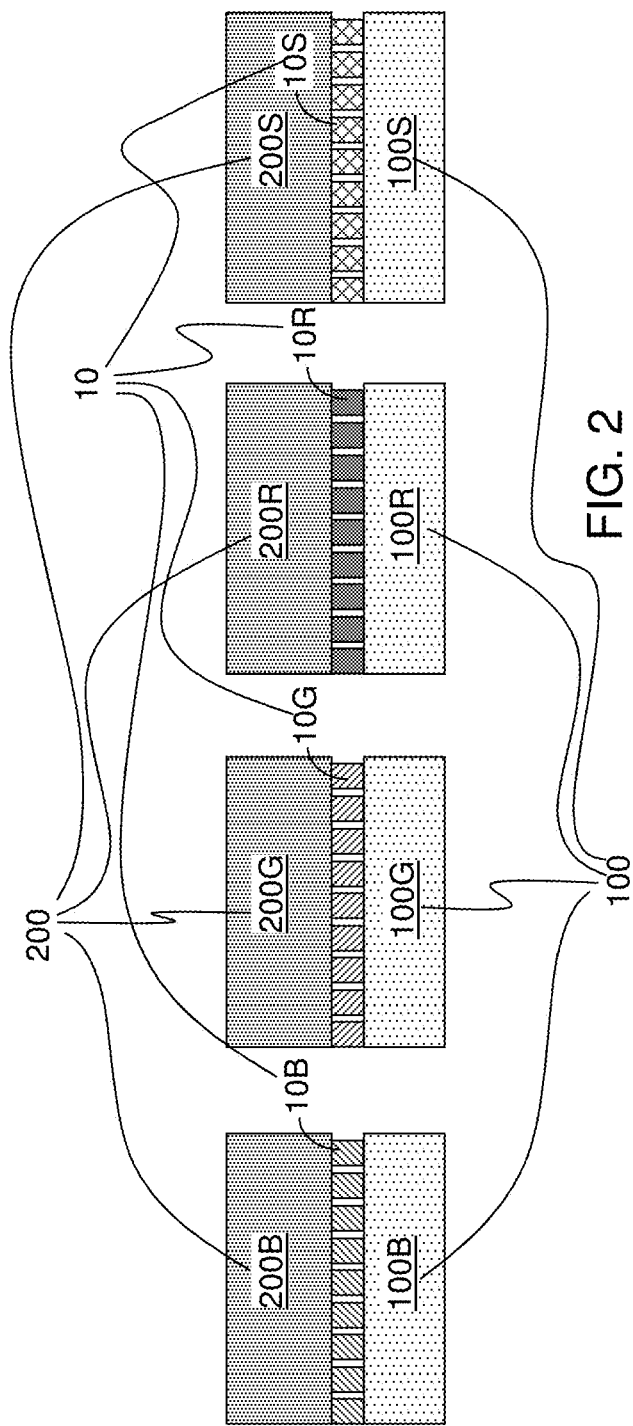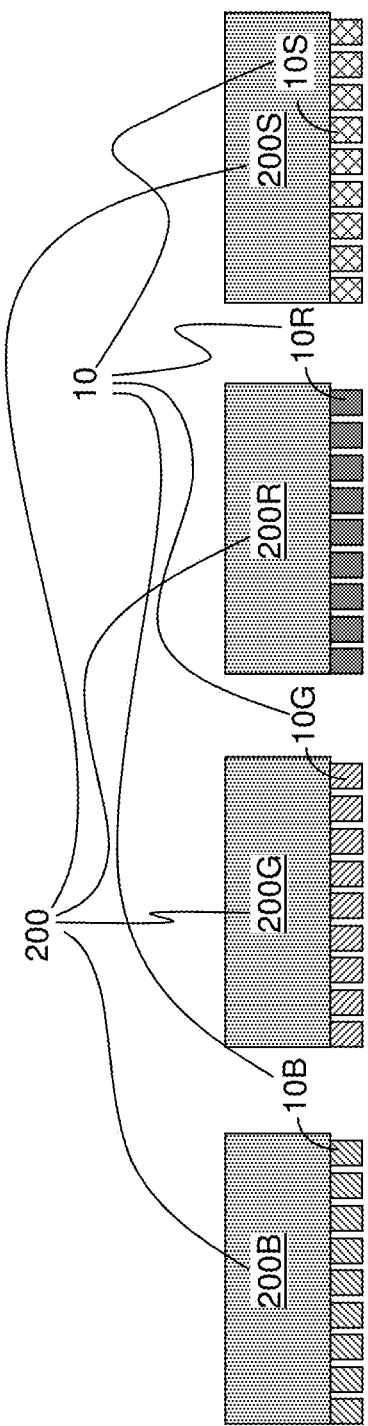

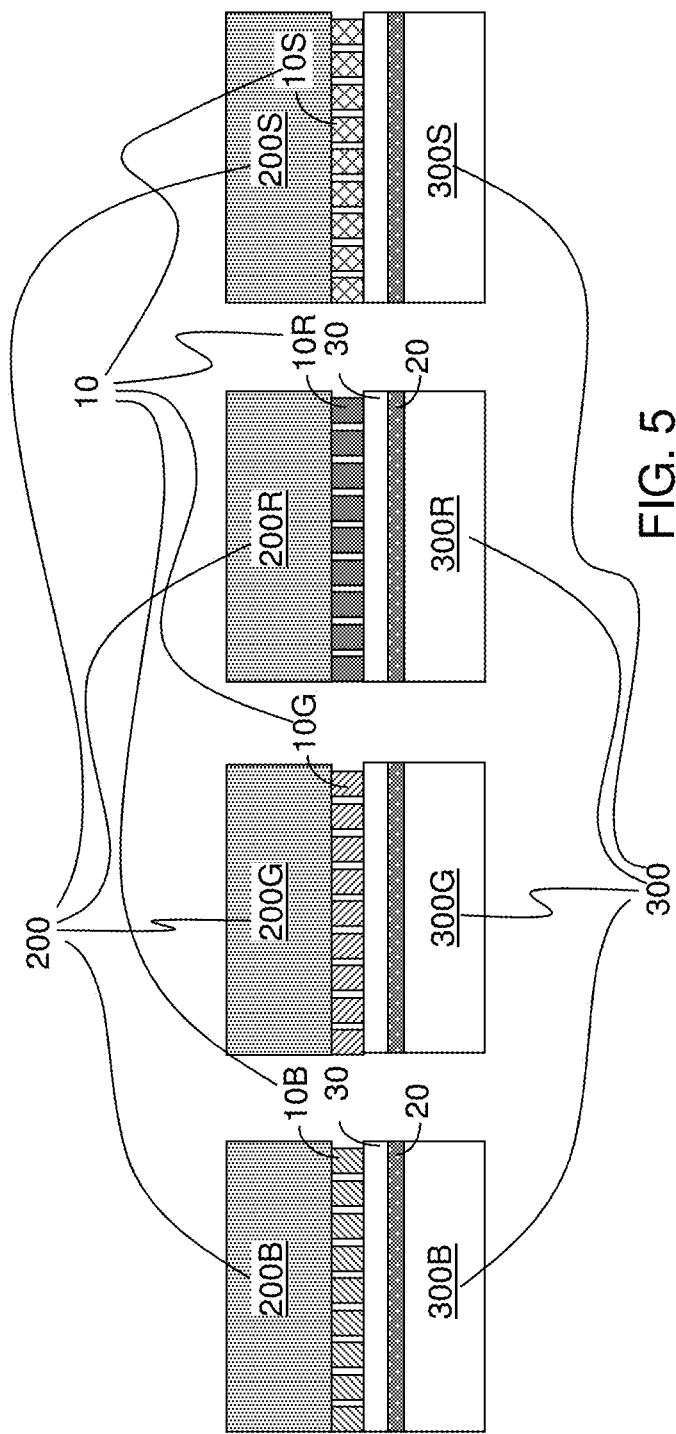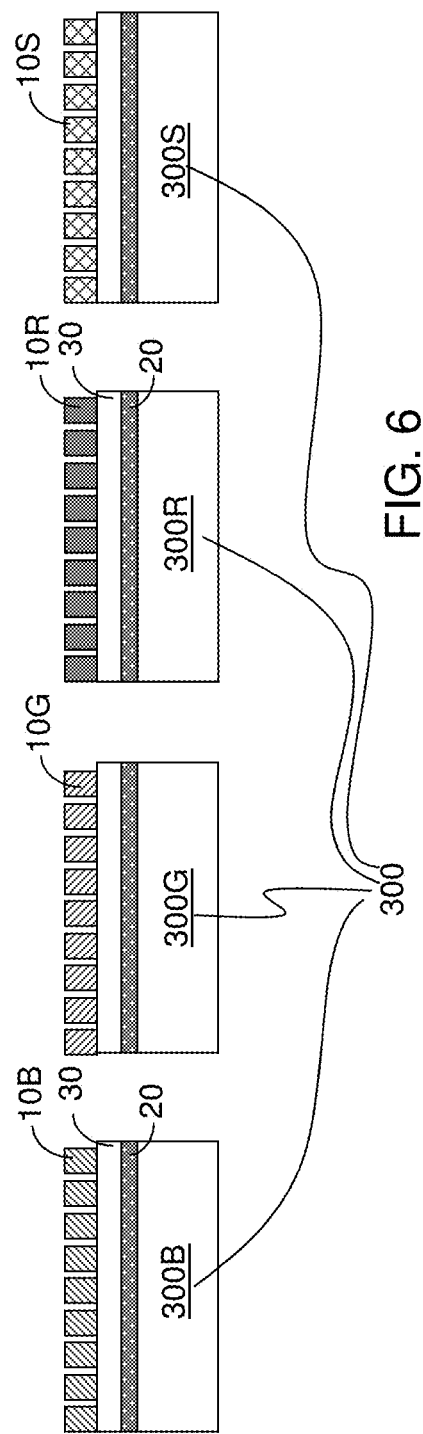

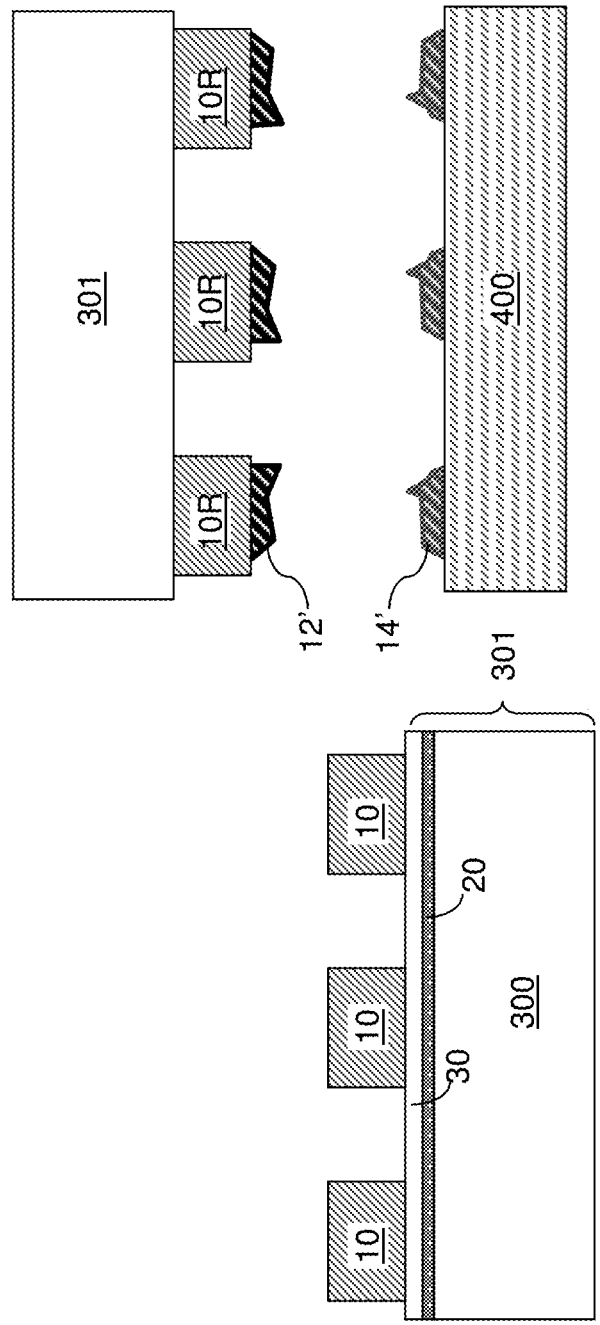

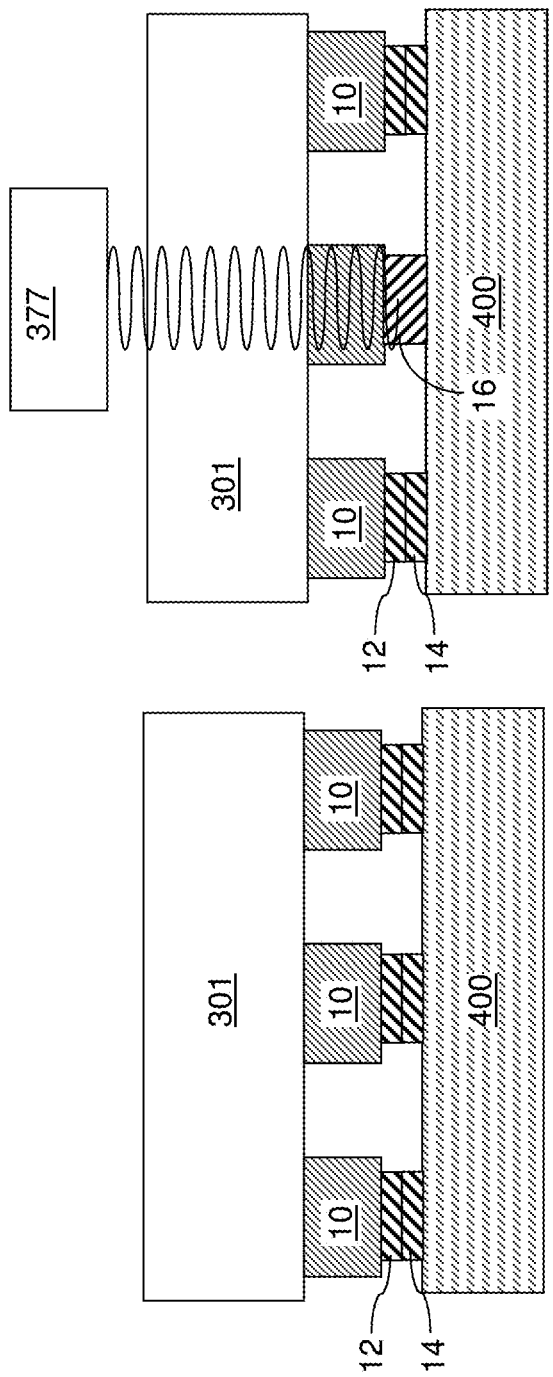

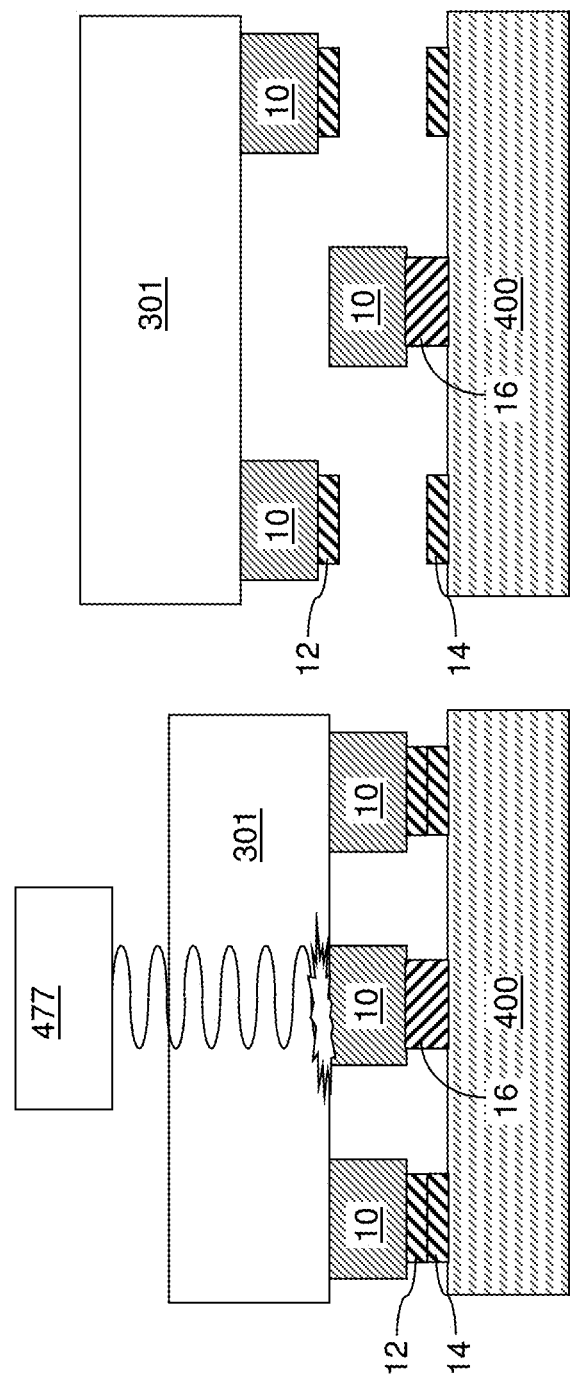

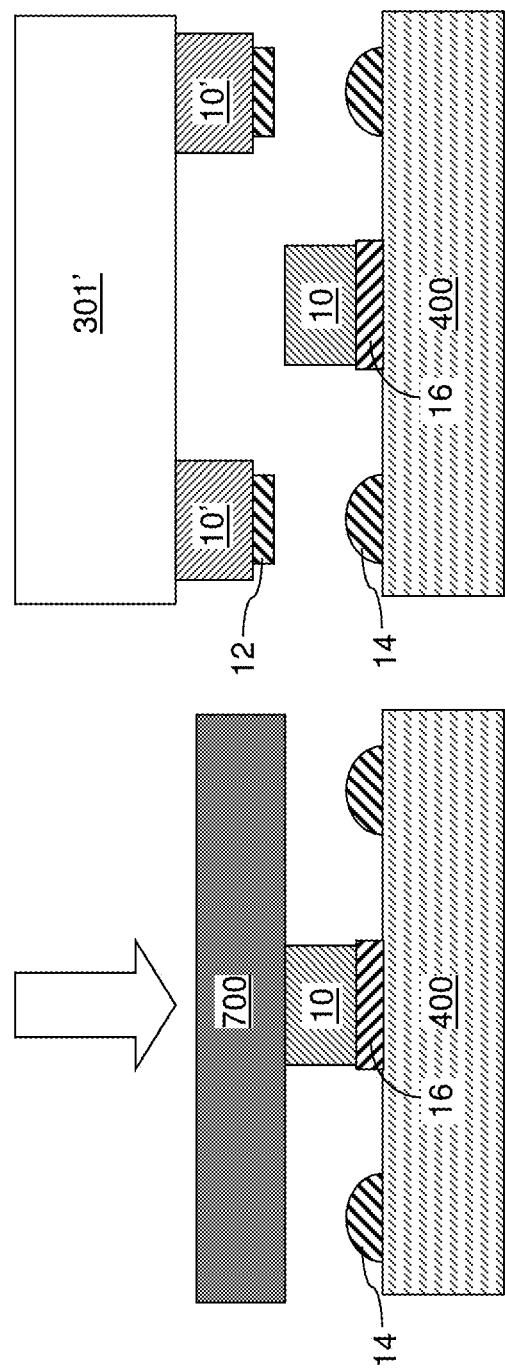

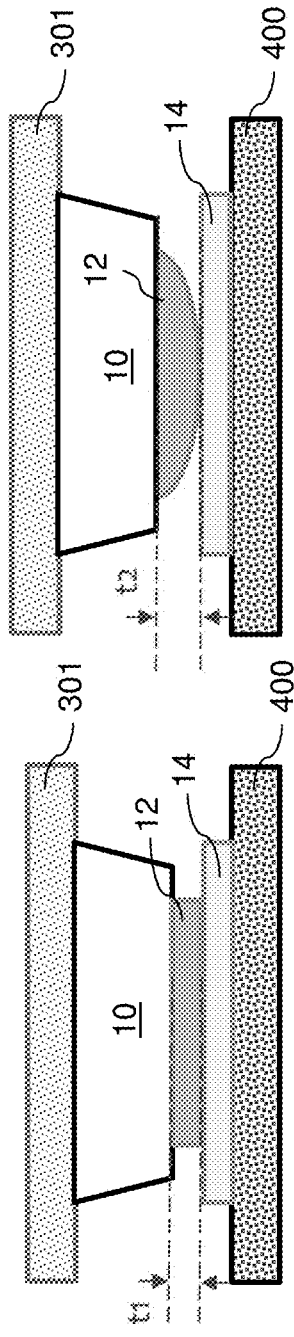
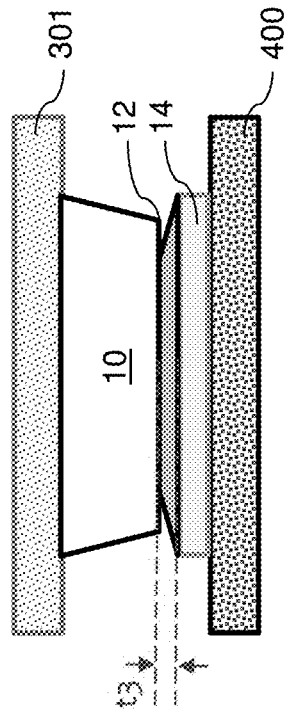
FIG. 14A
FIG. 14B
FIG. 14C

METHOD OF SELECTIVELY TRANSFERRING LED DIE TO A BACKPLANE USING HEIGHT CONTROLLED BONDING STRUCTURES

RELATED APPLICATIONS

The present application claims benefit of priority of U.S. Provisional Application Ser. No. 62/295,697, filed on Feb. 16, 2016, the entire disclosures of which are incorporated herein by reference.

FIELD

The embodiments of the invention are directed generally to methods of transferring devices, such as semiconductor light emitting devices to a target substrate. The methods of the present disclosure may be employed to form a direct view light emitting device display panel employing a light emitting device array on a backplane.

BACKGROUND

A device array including semiconductor devices such as light emitting diodes can be employed for various applications. For example, light emitting devices such as light emitting diodes are used in electronic displays, such as liquid crystal displays in laptops or LED television sets. Light emitting devices include light emitting diodes (LEDs) and various other types of electronic devices configured to emit light. Reliable methods are desired for systematically transferring a selected set of devices from a supply coupon to a target substrate.

SUMMARY

According to an aspect of the present disclosure, a method of transferring devices to a target substrate, comprises providing a supply coupon comprising a combination of a source substrate and devices thereupon, providing a target substrate that includes bonding sites, forming first bonding material portions on one of surfaces of the devices or surfaces of the bonding sites of the target substrate, coining the first bonding material portions to form first bonding material pads having a flatter bonding surface than that of the first bonding material portions, bonding a first set of the first bonding material pads with respective bonding structures to form a first set of bonded material portions, wherein the first set of the first bonding material pads is located on one of a first set of devices or the first set of bonding sites of the target substrate, and the bonding structures are located on another one of the first set of devices or the first set of the bonding sites of the target substrate, and detaching the first set of devices from the source substrate, wherein the first set of the devices is bonded to the bonding sites of the target substrate by the first set of bonded material portions, while a remaining second set of devices remains on the source substrate.

Another aspect of the present disclosure includes a method of transferring devices to a target substrate, comprising providing a target substrate that includes first and second sets of bonding sites, wherein a first set of devices is bonded to the first set of bonding sites by a first set of bonded material portions, and a second set of bonding sites contains a second set of bonding pads that are not bonded to devices, reflowing the second set of bonding pads to increase their thickness without increasing a thickness of the first set of bonding material portions, providing a supply coupon comprising a combination of a source substrate and second and third sets of devices thereupon, bonding the second set of devices to the second set of bonding sites on the target substrate such that a clearance space exists between the source substrate and the first set of devices, and detaching the second set of devices from the source substrate, wherein the second set of devices is bonded to the second set of bonding sites of the target substrate, while the second set of devices remains on the source substrate.

Another aspect of the present disclosure includes a method of transferring devices to a target substrate, comprising providing a supply coupon comprising a combination of a source substrate and devices thereupon, providing a target substrate that includes bonding sites, forming first bonding structures on a set of surfaces of the devices, each of the first bonding structures comprising a first wetting layer having a first lateral dimension, forming second bonding structures on a set of surfaces of the bonding sites of the target substrate, each of the second bonding structures comprising a second wetting layer having a second lateral dimension that is greater than the first lateral dimension, bringing the first bonding structures and the second bonding structures into physical contact, wherein each adjoining pair of a first bonding structure and a second bonding structure includes at least one bonding material portion, and bonding a subset of adjoining pairs of a first bonding structure and a second bonding structure to form a bonded material portion having a trapezoidal vertical cross-sectional profile.

Another aspect of the present disclosure includes a light emitting device, comprising a back plane substrate, a plurality of light emitting devices bonded to the back plate substrate, and a plurality of bonded material portions located between the back plane substrate and the plurality of light emitting devices. The bonded material portions bond the plurality of light emitting devices to the back plane substrate, and the bonded material portions have a trapezoidal vertical cross-sectional profile.

BRIEF DESCRIPTION OF THE DRAWINGS

FIG. 2 is a schematic illustration of the step of bonding of the growth substrates to respective first carrier substrates through the respective devices according to an embodiment of the present disclosure.

FIG. 3 is a schematic illustration of the step of removing the growth substrates according to an embodiment of the present disclosure.

FIG. 5 is a schematic illustration of the step of bonding each pair of a first carrier substrate and a second carrier substrate according to an embodiment of the present disclosure.

FIG. 6 is a schematic illustration of the step in which each first carrier substrate is removed from a bonded structure according to an embodiment of the present disclosure.

FIG. 7 is a vertical cross-sectional view of a supply coupon including a source substrate and devices thereupon according to an embodiment of the present disclosure.

FIG. 8 is a vertical cross-sectional view of a comparative exemplary structure that is not conducive to uniform surface-to-surface contacts between vertically facing pairs of bonding structures.

FIGS. 11A-11H are sequential vertical cross-sectional views of a target substrate and transferred devices during various steps of the transfer process according to an embodiment of the present disclosure.

FIGS. 14A-14C are sequential vertical cross-sectional views of a target substrate, a transferred device, and bonding structures therebetween during a third exemplary bonding process according to an embodiment of the present disclosure.

DETAILED DESCRIPTION

Figure 1:
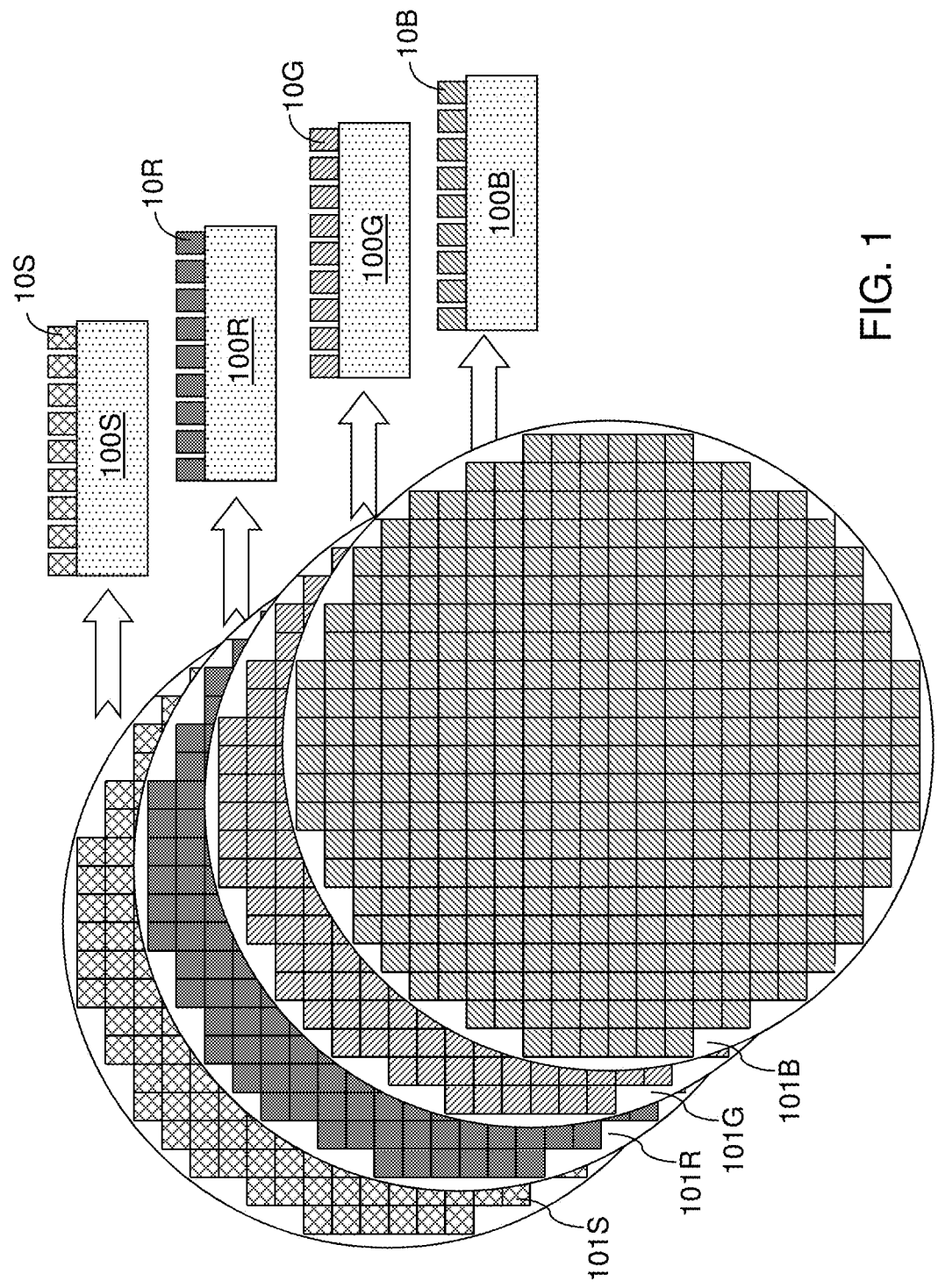
FIG. 1 is a schematic illustration of the step of generation of assemblies of growth substrates with respective devices thereupon from initial growth substrates according to an embodiment of the present disclosure.

As stated above, the present disclosure is directed to an assembly of integrated back light units, and a method of manufacturing the same, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "light emitting device" refers to any device that is configured to emit light and includes, but is not limited to, a light emitting diode (LED), a laser, such as a vertical-cavity surface-emitting laser (VCSEL), and any other electronic device that is configured to emit light upon application of a suitable electrical bias. A light emitting device may be a vertical structure (e.g., a vertical LED) in which the p-side and n-side contacts are located on opposite sides of the structure or a lateral structure in which the p-side and n-side contacts are located on the same side of the structure. As used herein, a "light emitting device assembly" refers to an assembly in which at least one light emitting device is structurally fixed with respect to a support structure, which can include, for example, a substrate, a matrix, or any other structure configured to provide stable mechanical support to the at least one light emitting device.

In the present disclosure, a method is provided for transferring an array of devices (such as an array of light emitting devices or an array of sensor devices) from a growth substrate to a target substrate. The target substrate may be any substrate on which formation of multiple types of devices in any configuration is desired. In an illustrative example, the target substrate may be a backplane substrate such as an active or passive matrix backplane substrate for driving light emitting devices. As used herein, a "backplane substrate" refers to any substrate configured to affix multiple devices thereupon. In one embodiment, the center-to-center spacing of neighboring light emitting devices on the backplane substrate can be is an integer multiple of the center-to-center spacing of neighboring light emitting devices on the growth substrate. The light emitting devices may include a plurality of light emitting devices, such as a group of two light emitting devices, one configured to emit blue light and one configured to emit green light. The light emitting devices may include a group of three light emitting devices, one configured to emit blue light, one configured to emit green light, and one configured to emit red light. As used herein, "neighboring light emitting devices" refer to a plurality of two or more light emitting devices located in closer proximity than at least another light emitting device. The method of the present disclosure can provide selective transfer of a subset of light emitting devices from a light emitting device array on a growth substrate to the backplane substrate.

Referring to FIG. 1, devices (10B, 10G, 10R, 10S) can be fabricated on respective initial growth substrates (101B, 101G, 101R, 101S) employing methods known in the art. As used herein, an "initial growth substrate" refers to a substrate that is processed to form devices thereupon or therein. The devices (10B, 10G, 10R, 10S) can include light emitting devices (10B, 10G, 10R) and/or sensor devices 10S (e.g., photodetectors) and/or any other electronic devices. The light emitting devices (10B, 10G, 10R) can be any type of light emitting devices, i.e., vertical light emitting devices, lateral light emitting devices, or any combination thereof. Devices of the same type can be formed on each initial growth substrate (101B, 101G, 101R, 101S). The devices (10B, 10G, 10R, 10S) can be formed as an array on the respective initial growth substrates (101B, 101G, 101R, 101S).

In one embodiment, the initial growth substrates (101B, 101G, 101R, 101S) can include an absorbing substrate such as a silicon substrate. As used herein, an "absorbing substrate" refers to a substrate that absorbs more than 50% of light energy within the spectrum range including ultraviolet range, visible range, and infrared range. As used herein, "ultraviolet range" refers to the wavelength range from 10 nm to 400 nm; "visible range" refers to the wavelength range from 400 nm to 800 nm, and "infrared range" refers to the wavelength range from 800 nm to 1 mm.

If the initial growth substrates (101B, 101G, 101R, 101S) are absorbing substrates, each array of devices (10B, 10G, 10R, 10S) can be transferred to a respective transparent carrier substrates, or a "transparent substrate," by full wafer transfer processes in which each array of devices (10B, 10G, 10R, 10S) is transferred to the respective transparent substrate in its entirety. As used herein, a "transparent substrate" refers to a substrate that transmits more than 50% of light energy at a wavelength within the spectrum range including ultraviolet range, visible range, and infrared range.

In one embodiment, devices (10B, 10G, 10R, 10S) can include light emitting devices (10B, 10G, 10R). In one embodiment, each light emitting device (10B, 10G, 10R) can be configured to emit light of a single peak wavelength. It is understood that light emitting devices typically emit light of a narrow wavelength band centered around the single wavelength at which the intensity of light is at a maximum, and the wavelength of a light emitting device refers to the peak wavelength. For example, an array of first light emitting devices 10B can be formed on a first-type growth substrate 100B, an array of second light emitting devices 10G can be formed on a second-type growth substrate 100G, and an array of third light emitting devices 10R can be formed on a third-type growth substrate 100R. In addition, an array of sensor devices 10S can be formed on a fourth-type growth substrate 100S. Alternatively, one or more types of light emitting devices (10B, 10G, 10R) can be integrated light emitting devices that are configured to emit light of at least two different wavelengths. In one embodiment, the light emitting devices (10B, 10G, 10R) may comprise arrays of nanowires or other nanostructures.

Contact structures (not explicitly shown) such as contact pads are provided on each light emitting device (10B, 10G, 10R). The contact structures for each light emitting device (10B, 10G, 10R) can include an anode contact structure and a cathode contact structure. In case one or more of the light emitting devices (10B, 10G, 10R) is an integrated light emitting device configured to emit light of at least two different wavelengths, a common contact structure (such as a common cathode contact structure) can be employed. For example, a triplet of blue, green, and red light emitting devices embodied as a single integrated light emitting device may have a single cathode contact.

The array of light emitting devices (10B, 10G, 10R) on each initial growth substrate (101B, 101G, 101R) is configured such that the center-to-center spacing of light emitting devices on a backplane substrate to which the light emitting devices are subsequently transferred is an integer multiple of the center-to-center spacing of light emitting devices (10B, 10G, 10R) on the initial growth substrate (101B, 101G, 101R).

Each initial growth substrate (101B, 101G, 101R, 101S) and devices (10B, 10G, 10R, 10S) thereupon can be diced into suitable sizes. Each diced portion of the initial growth substrate (101B, 101G, 101R, 101S) is herein referred to as a growth substrate (100B, 100G, 100R, 100S). Assemblies of growth substrates (100B, 100G, 100R, 100S) with respective devices (10B, 10G, 10R, 10S) thereupon are thus generated. In other words, the growth substrates (100B, 100G, 100R, 100S) are either the entirety or the diced portions of the initial growth substrates (101B, 101G, 101R, 101S), and an array of devices (10B, 10G, 10R, 10S) is present on each growth substrate (100B, 100G, 100R, 100S). The array of devices (10B, 10G, 10R, 10S) on each growth substrate (100B, 100G, 100R, 100S) can be an array of devices of the same type.

Prior to, or after, each initial growth substrate (101B, 101G, 101R, 101S) is singulated to corresponding growth substrates (100B, 100G, 100R, 100S), each device (10B, 10G, 10R, 10S), e.g., a light emitting device, a group of light emitting devices, or a sensor device, can be mechanically isolated from one another by forming trenches between each neighboring pair of the devices. In an illustrative example, if a light emitting device array or a sensor array is disposed on an initial growth substrate (101B, 101G, 101R, 101S), the trenches can extend from the final growth surface of the light emitting device array or the sensor array to the top surface of the initial growth substrate (101B, 101G, 101R, 101S).

Various schemes may be employed to transfer each array of devices (10B, 10G, 10R, 10S) to a respective transparent substrate. FIGS. 2-6 illustrate an exemplary scheme that can be employed to transfer each array of devices (10B, 10G, 10R, 10S) to a respective transparent substrate.

Referring to FIG. 2, first carrier substrates 200 can be optionally employed in case the contact structures on each device (10B, 10G, 10R, 10S) are formed on the top side of each device (10B, 10G, 10R, 10S) during fabrication of the devices (10B, 10G, 10R, 10S) on the growth substrates (101B, 101G, 101R, 101S). The first carrier substrates 200 can be any suitable substrate that can be bonded to the devices (10B, 10G, 10R, 10S) and can provide structural support to the (10B, 10G, 10R, 10S). Each as-grown array of devices (10B, 10G, 10R, 10S) and a respective growth substrate 100 is bonded to a first carrier substrate 200. Thus, each growth substrate 100 can be bonded to a respective first carrier substrate 200 through the respective devices 10. In other words, the devices 10 are present between a growth substrate 100 and a first carrier substrate within each bonded structure (100, 10, 200). In an illustrative example, a first-type growth substrate 100B can be bonded to a first-type first carrier substrate 200B through first light emitting devices 10B, a second-type growth substrate 100G can be bonded to a second-type first carrier substrate 200G through second light emitting devices 10G, a third-type growth substrate 100R can be bonded to a third-type first carrier substrate 200R through third light emitting devices 10R, and a fourth-type growth substrate 100S can be bonded to a fourth-type first carrier substrate 200S through the sensor devices 10S.

Referring to FIG. 3, each growth substrate 100 can be removed from the transient bonded structure including the stack of the growth substrate 100, an array of devices 10, and the first carrier substrate 200. For example, if the growth substrate 100 is a silicon substrate, the growth substrate 100 can be removed by a wet chemical etch process, grinding, polishing, splitting (for example, at a hydrogen implanted layer), or a combination thereof. For example, splitting of a substrate can be performed by implanting atoms that form a weak region (such as hydrogen atoms implanted into a semiconductor material) and by applying a suitable processing conditions (for example, an anneal at an elevated temperature and/or mechanical force) to cause the substrate to split into two parts.

Figure 4:
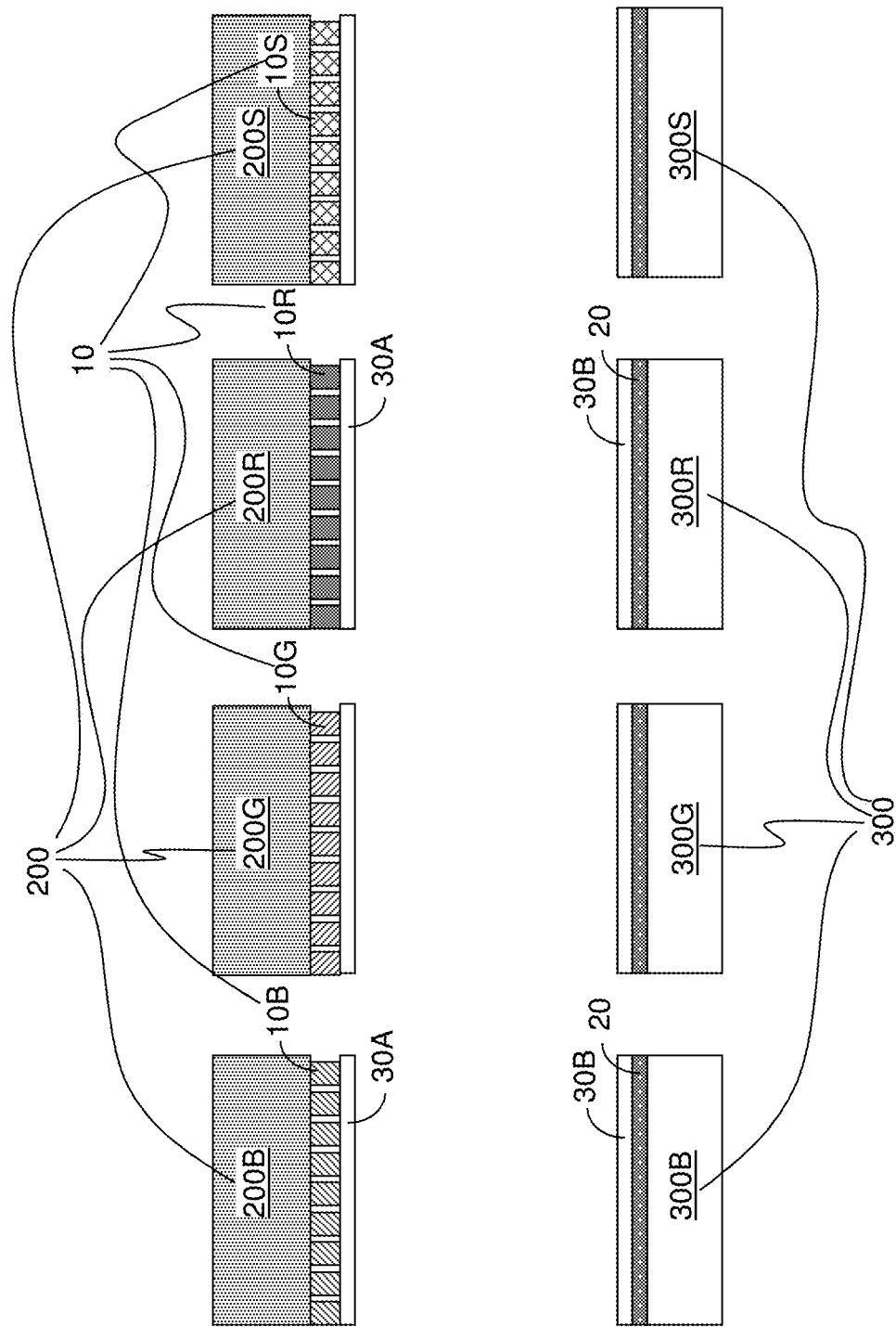
FIG. 4 is a schematic illustration of the step of forming a first bonding material layer on the first carrier substrates, providing second carrier substrate, and forming a release layer and a second bonding material layer according to an embodiment of the present disclosure.

Referring to FIG. 4, a first bonding material layer 30A can be formed on each first carrier substrate 200. The first bonding material layer 30A includes any bonding material that can be bonded to another bonding material upon suitable treatment (such as application of heat and/or pressure). In one embodiment, the first bonding material layer 30A can comprise a dielectric material such as silicon oxide, borophosphosilicate glass (BPSG), a spin-on glass (SOG) material, and/or an adhesive bonding material such as SU-8 or benzocyclobutene (BCB). The thickness of the first bonding material layer 30A can be in a range from 50 nm to 5 micron, although lesser and greater thicknesses can also be employed. In one embodiment, the first bonding material layer 30A can be a silicon oxide layer having a thickness of about 1 micron. The first bonding material layer 30A can be formed by a suitable deposition method such as chemical vapor deposition or spin coating.

Transfer substrates 300 are provided. As used herein, a "transfer substrate" refers to a substrate from which at least one device is transferred to a target substrate, which can comprise a backplane substrate. In one embodiment, each transfer substrate 300 can be a second carrier substrate, which can be employed to receive an array of devices from a respective first carrier substrate 200 and to carry the array of devices until a subset of the devices are transferred to the target substrate in a subsequent process.

In some embodiments, the transfer substrates 300 can be optically transparent at a laser wavelength. The laser wavelength is the wavelength of the laser beam to be subsequently employed to transfer devices individually and selectively from a respective transfer substrate 300 to the target substrate, and can be an ultraviolet wavelength, a visible wavelength, or an infrared wavelength. In one embodiment, the transparent substrates 300 can include sapphire, glass (silicon oxide), or other optically transparent material known in the art. In an alternative embodiment, the transfer substrates 300 can be transparent growth substrates or diced portions thereof. In some other embodiments in which initial growth substrates are cleaved (for example, at a layer implanted with hydrogen or noble gas) to provide a thin substrate from which light emitting diodes are transferred to a backplane without use of transfer substrates, the initial growth substrates may absorb laser at the laser wavelength.

A release layer 20 and a second bonding material layer 30B can be sequentially deposited on each transfer substrate 300. The release layer 20 includes a material that can provide sufficient adhesion to the transfer substrate 300 and is absorptive at the laser wavelength of the laser beam to be subsequently employed during a subsequent selective transfer process. For example, the release layer 20 can include silicon-rich silicon nitride or a semiconductor layer, such as a GaN layer that can be heated by laser irradiation. The thickness of the release layer 20 can be in a range from 100 nm to 1 micron, although lesser and greater thicknesses can also be employed.

The second bonding material layer 30B can comprise a dielectric material such as silicon oxide. The thickness of the second bonding material layer 30B can be in a range from 50 nm to 5 micron, although lesser and greater thicknesses can also be employed. In one embodiment, the second bonding material layer 30B can be a silicon oxide layer having a thickness of about 1 micron. The second bonding material layer 30B can be formed by a suitable deposition method such as chemical vapor deposition or spin coating.

A transfer substrate 300 can be provided for each first carrier substrate 200. For example, a first transfer substrate 300B can be provided for the first-type first carrier substrate 200B; a second transfer substrate 300G can be provided for the second-type first carrier substrate 200G; a third transfer substrate 300R can be provided for the third-type first carrier substrate 300R; and an additional transfer substrate 300S can be provided for the additional type first carrier substrate 300S. Multiple stacked structures can be formed, which include a first stacked structure (300B, 20, 30B) including a stack of the first transfer substrate 300B, a release layer 20, and a second bonding material layer 30B; a second stacked structure (300G, 20, 30B) including a stack of the second transfer substrate 300G, a release layer 20, and a second bonding material layer 30B; a third stacked structure (300R, 20, 30B) including a stack of the third transfer substrate 300R, a release layer 20, and a second bonding material layer 30B; and an additional stacked structure (300S, 20, 30B) including a stack of the additional transfer substrate 300S, a release layer 20, and a second bonding material layer 30B.

The combination of the array of first light emitting devices 10B and the first transfer substrate 300B is herein referred to as a first transfer assembly (300B, 10B), the combination of the second light emitting devices 10G and the second transfer substrate 300G is herein referred to as a second transfer assembly (300G, 10G), and the combination of the third light emitting devices 10R and the third transfer substrate 300R is herein referred to as a third transfer assembly (300R, 10R). In addition, the combination of the sensor devices 10S and the fourth transfer substrate 300S is herein referred to as fourth transfer assembly (300S, 10S).

Referring to FIG. 5, each pair of a first carrier substrate 200 and a transfer substrate 300 (which can be a second carrier substrate) can be bonded. For example, the second bonding material layer 30B can be bonded with the respective first bonding material layer 30A on the corresponding first carrier substrate 200 to form a bonding material layer 30. Each bonded assembly comprises a first transfer substrate 300, a release layer 20, a bonding material layer 30, and an array of devices 10.

Referring to FIG. 6, a first carrier substrate 200 is removed from each bonded assembly (300, 20, 30, 200), for example, by polishing, grinding, cleaving, and/or chemical etching. Each array of devices 20 can be disposed on a transfer substrate 300, which is a transparent carrier substrate with a release layer 20 thereupon, i.e., between the transparent carrier substrate and the array of devices 20.

Generally speaking, an array of devices can be provided on a source substrate such that each device is laterally spaced from neighboring devices by trenches. The combination of the array of devices and the source substrate constitutes a source coupon from which the devices can be subsequently transferred to a target substrate.

Referring to FIG. 7, an exemplary source coupon (301, 10) is illustrated, which includes a source substrate 301 and an array of devices 10. The devices 10 can be selected from light emitting diodes and semiconductor sensor devices. For example, the diodes 10 may be light emitting diodes that emit light of a same wavelength (i.e., a light spectrum centered at the same wavelength) or a semiconductor sensor device of a same type that senses the same type of input (e.g., pressure sensor, electrical current sensor, etc.) In an illustrative example, the devices 10 may be red light emitting diodes, green light emitting diodes, or blue light emitting diodes. In one embodiment, the devices 10 on the source substrate 301 can be arranged in a two-dimensional periodic array.

The source substrate 301 may be any type of substrate described above provided that the source substrate 301 can have the array of devices 10 thereupon. In one embodiment, the source substrate 301 may be any of an initial growth substrate (101B, 101G, 101R, or 101S), a first carrier substrate 200, or a transfer substrate 300. In an illustrative embodiment, source substrate 301 can be an initial growth substrate (101B, 101G, 101R, or 101S), and the devices 10 can be manufactured on the source substrate 301 by performing deposition processes and patterning processes directly on the source substrate 301 and subsequently dicing patterned structures on the source substrate 301. In another illustrative embodiment, the source substrate 301 may be a first carrier substrate 200 or a transfer substrate 300 containing a release layer 20 and/or a bonding material layer 30, and the devices 10 can be manufactured on an initial growth substrate (101B, 101G, 101R, or 101S) by performing deposition processes and patterning processes directly on the initial growth substrate (101B, 101G, 101R, or 101S), subsequently dicing patterned structures on the initial growth substrate (101B, 101G, 101R, or 101S), and transferring the diced patterned structures to the source substrate 301 either directly or indirectly through an intermediate substrate.

Referring to FIG. 8, a comparative exemplary structure is provided, which includes a source coupon and a target substrate 400 to which the devices 10 are to be transferred. As used herein, a "target substrate" refers to substrate to which an element is transferred, i.e., a substrate that functions as a destination of transferred element. The target substrate 400 includes bonding sites at which devices 10 can be bonded to the target substrate 400. Bonding materials (12', 14') can be applied to the facing surfaces of the devices 10 and the target substrate 400. As used herein, bonding materials include elemental metals and metal alloys which has a relatively low melting temperature, such as a temperature below 450° C., including tin, indium, alloys thereof, etc. These bonding materials are referred to as "solder" materials for ease of description herein. However, as used herein solder materials are not limited to tin-lead alloys. A general issue when solder material is applied to any surface is that the top surfaces of the solder material portions are generally non-planar, and contact between non-planar surfaces can lead to non-uniform contact and heat transfer between the pairs of the solder material portions across different bonding sites.

Figure 9:
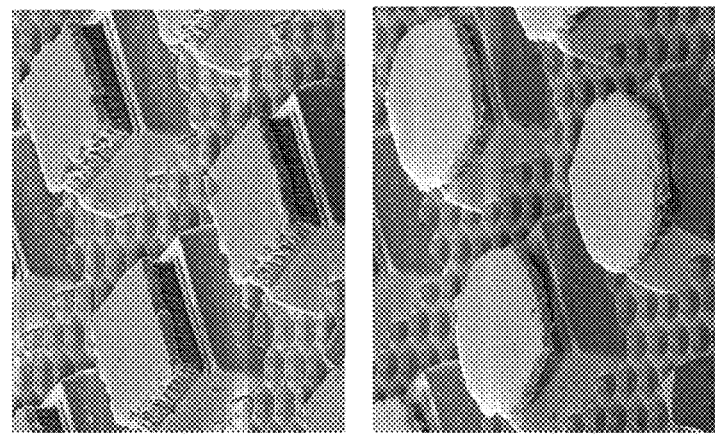
FIG. 9 is a vertical cross-sectional view of an exemplary structure including at least one set of coined bonding structures according to an embodiment of the present disclosure.
Figure 10:
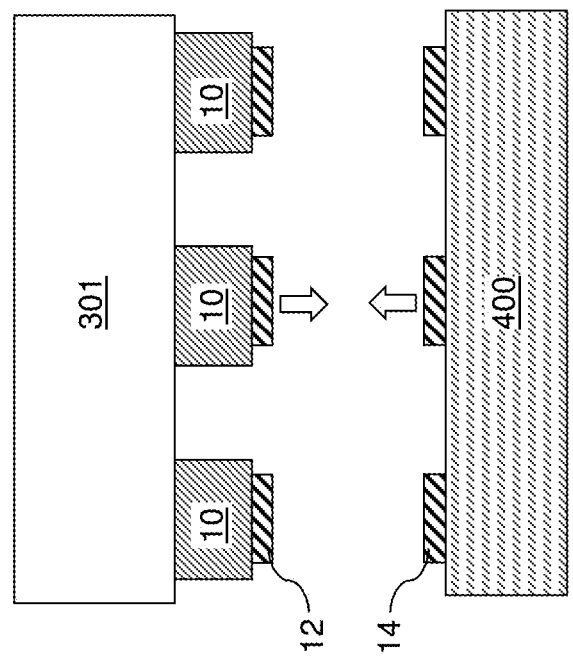
FIG. 10 is a perspective view micrograph of a set of coined bonding structures including solder material portions according to an embodiment of the present disclosure.

Referring to FIGS. 9 and 10, coining can be performed to at least one set of bonding structures (12, 14) located on the respective devices 10 or the target substrate 400. As used herein, "coining" refers to the act of flattening exposed surfaces of the bonding structures (12, 14). The exposed surfaces of the bonding structures may be flattened by being pressed against each other (i.e., pressing structure 12 against structure 14 as shown by the arrows in FIG. 9), preferably at above room temperature. Alternatively, the exposed surfaces of the bonding structures may be flattened by being pressed against another flat surface, such as a press mold surface, preferably at above room temperature. FIG. 9 schematically shows the configuration of a supply coupon with first bonding structures 12 thereupon that faces the target substrate 400 with second bonding structures 14 thereupon. FIG. 10 shows micrographs of coined bonding structures, which can be employed as the first bonding structures 12 if formed on devices 10 or as the second bonding structures 14 if coined on the target substrate 400.

Generally, the first bonding structures 12 can be formed on a set of surfaces of the devices 10, and the second bonding structures 14 can be formed on a set of surfaces of the bonding sites of the target substrate 400. Optionally, each of the first bonding structures 12 may include a first wetting layer (not shown), and each of the second bonding structures 14 may include a second wetting layer (not shown).

The first bonding structures 12 and/or the second bonding structures 14 include a solder material. As used herein, a "solder material" refers to a filler material, such as an electrically conductive material, for example, a metal that can be melted and flowed into a joint region between two electrically conductive portions (e.g., electrodes on the devices 10 and/or on the substrate 400) that do not melt at the temperature at which the filler material melts and reflows. A first set of solder material portions are formed on a first set of surfaces. The first set of surfaces is selected from a set of surfaces of the devices 10 and a set of surfaces of the bonding sites of the target substrate 400. In one embodiment, the first set of solder material portions may be present in the first bonding structures 12. In another embodiment, the first set of solder material portions may be present in the second bonding structures 14.

In one embodiment, the first set of solder material portions can be coined into a set of solder material pads having a uniform height, which may be selected from a range from 100 nm to 30 microns, although lesser and greater thicknesses can also be employed. In one embodiment, the first set of solder material portions and the set of solder material pads can be formed on the set of surfaces of the devices 10. In another embodiment, the first set of solder material portions and the set of solder material pads can be formed on the set of surfaces of the bonding sites of the source substrate 400.

Optionally, a second set of solder material portions can be formed on a second set of surfaces different from the first set of surfaces. The second set of surfaces can be selected from the set of surfaces of the devices 10 and the set of surfaces of the bonding sites of the source substrate 400. In this case, one set of surfaces selected from the set of surfaces of the devices 10 and the set of surfaces of the bonding sites of the source substrate 400 can be the first set of surfaces on which the first set of solder material portions is formed, and the other set of surfaces selected from the set of surfaces of the devices 10 and the set of surfaces of the bonding sites of the source substrate 400 can be the second set of surfaces on which the second set of solder material portions is formed. In this case, the second set of solder material portions can be coined into the respective bonding structures having another uniform height that may, or may not, be the same as the uniform height of the first set of solder material portions.

In one embodiment, a set of bonding structures selected from the first bonding structures 12 and the second bonding structures 14 is coined to form the solder material portions. For example, structures 12 may be pressed against structures 14 using a press. For example, the coining force of 10 to 60 Newtons, such as 20 to 50 Newtons may be applied for 1 to 60 seconds, such as 10 to 30 seconds, at above room temperature to press the substrates 301 and 400 together while structures 12 and 14 contact each other. The coining temperature may be in a range from room temperature (20° C.) to 90 percent of the melting temperature of the material of the structures 12 and 14. For example, for tin structures 12 and 14, the coining temperature may be between 200 and 230° C. The coined set of bonding structures has the uniform height. In one embodiment, the first bonding structures 12 comprise at least a subset of the solder material portions. Alternatively or additionally, the second bonding structures 14 can comprise at least a subset of the solder material portions.

In one embodiment, the first set of solder material portions can be coined into the set of solder material pads by applying a pressure in a range from $0.5 \times 10^6$ Pascal to $2.0 \times 10^7$ Pascal, and/or in a range from $1.0 \times 10^6$ Pascal to $1.2 \times 10^7$ Pascal, and/or in a range from $1.5 \times 10^6$ Pascal to $6.0 \times 10^6$ Pascal. If the second set of solder material portions is employed, the second set of solder material portions can be coined into the set of solder material pads by applying a pressure in a range from $0.5 \times 10^6$ Pascal to $2.0 \times 10^7$ Pascal, and/or in a range from $1.0 \times 10^6$ Pascal to $1.2 \times 10^7$ Pascal, and/or in a range from $1.5 \times 10^6$ Pascal to $6.0 \times 10^6$ Pascal. The above pressure ranges translate to force ranges when the total area of the coined set of solder material portions is provided. In an illustrated example, the force may be in a range from 20 N for a low density, smaller display to 1 kN for a larger display (e.g., 2" in size) with a high dots per inch (dpi) count.

In one embodiment, the target substrate 400 can be a backplane substrate for an direct view LED display panel configured to support an array of light emitting devices. Generally, the target substrate 400 is a substrate onto which various devices can be subsequently transferred. In one embodiment, the target substrate 400 can be a substrate of silicon, glass, plastic, and/or at least other material that can provide structural support to the devices to be subsequently transferred thereupon. In one embodiment, the target substrate 400 may be a passive backplane substrate, in which metal interconnect structures comprising metallization lines are present, for example, in a criss-cross grid and active device circuits are not present. In another embodiment, the target substrate 400 may be an active backplane substrate, which includes metal interconnect structures as a criss-cross grid of conductive lines and further includes a device circuitry at one or more intersections of the criss-cross grid of conductive lines. The device circuitry can comprises one or more transistors.

FIGS. 11A-11H illustrate vertical cross-sectional views of the target substrate 400 and devices prior to, during, or after transfer.

Referring to FIG. 11A, the first bonding structures 12 and the second bonding structures 14 are brought into contact with each other so that an adjoining pair of a first bonding structure 12 and a second bonding structure 14 is formed at each bonding site on the substrate 400. In one embodiment, planar contact surfaces can be formed between the first set of solder (i.e., bonding) material pads (as embodied by the first bonding structures 12 or the second bonding structures 14) with respective bonding structures (as embodied by the bonding structures that the solder material pads contact). The first set of solder material pads are located on one of the supply coupon and the target substrate 400, and the respective bonding structures are located on another of the supply coupon and the target substrate 400.

In one embodiment, both the first bonding structures 12 and the second bonding structures 14 include coined solder (i.e., bonding) materials. In this case, the respective bonding structures comprise the material of the second set of solder material portions. The planar contact surfaces are formed between the first bonding structures 12 and the second bonding structures 14 such that each adjoining pair of a first bonding structure 12 and a second bonding structure 14 includes two solder material portions.

In one embodiment, only one set of bonding structures selected from the first bonding structures 12 and the second bonding structures 14 includes a solder (i.e., bonding) material. In this case, the respective bonding structures comprise a metallic material that is not a solder material. The planar contact surfaces are formed between the first bonding structures 12 and the second bonding structures 14 such that each adjoining pair of a first bonding structure 12 and a second bonding structure 14 includes one solder material portion.

Referring to FIG. 11B, a subset of the devices 10 can be bonded to a subset of the bonding sites of the target substrate 400 by reflowing a subset of the solder material pads underlying or overlying the subset of the devices 10. In one embodiment, a subset of adjoining pairs of a first bonding structure 12 and a second bonding structure 14 can be sequentially bonded by sequentially reflowing respective at least one solder material portion (as embodied as a portion of a first bonding structure 12 and/or a portion of a second bonding structure 14) without reflowing a complementary subset of bonding structures (12, 14) of the adjacent devices 10. The complementary subset can be a non-empty set. A first subset of the devices 10 can be bonded to a first subset of the bonding sites of the target substrate 400 at each bonding site at which bonding is performed, while a second (complementary) subset of the devices 10 is not bonded to a second (complementary) subset of the bonding sites of the target substrate 400 at each bonding site at which bonding is not performed. In one embodiment, the selection of the bonding site at which boning is performed can be selected such that the bonded devices 10 form a periodic array.

In one embodiment, the reflowing of the subset of the solder material pads (as embodied as a portion of a first bonding structure 12 and/or a portion of a second bonding structure 14) can be performed by irradiating a laser beam from laser 377 on each solder material pads to be reflowed. The wavelength of the laser beam can be selected such that the laser beam passes through the source substrate 301 and the devices 10. In this case, the laser beam can pass through the source substrate 301 and a respective device 10 before illumination on each solder material pad. Alternatively, if the target substrate 400 includes a material though which the laser beam passed without significant absorption, the laser beam can pass through the target substrate 400. In one embodiment, the wavelength of the laser beam can be in a visible light range (i.e., a wavelength range from 400 nm to 800 nm) or in the infrared range.

A bonded solder material portion 16 is formed by reflow of each solder material pad formed by coining and optionally, if present, by reflow of any additional solder material that may not have been coined. Each bonded solder material portion 16 includes a reflowed and re-solidified solder material and additionally includes a pair of metal pads (not separately shown) that are attached to the target substrate 400 and a respective device 10.

Referring to FIG. 11C, the subset of the devices 10 that are bonded to the target substrate 400 can be detached from the source substrate 301 such that the subset of the devices 10 is transferred to the target substrate 400. In one embodiment, the detachment of the subset of the devices 10 can be performed by sequential laser irradiation from layer 477 and heating of the surface portions of the source substrate 301 that contacts the subset of the devices 10 that are bonded to the target substrate 400. In an illustrative example, the source substrate 301 can include a release layer (such as the release layer 20 illustrated in FIG. 7). The release layer can include silicon-rich silicon nitride or a semiconductor layer, such as a GaN layer that can be heated by laser irradiation.

In one embodiment, each device 10 bonded to the target substrate 400 can be detached employing targeted laser irradiation emitted by a laser 477. The material of the surface portion of the source substrate 301 that is proximal to the devices 10 can be selected such that the laser beam is absorbed by the surface portion of the source substrate 301. The size of the laser beam, or the size of the raster area of the laser beam if the laser beam is rastered, can be selected to substantially match the area of each device 10 to be detached. In one embodiment, the irradiated surface portion of the source substrate 301 (e.g., the release layer 20) can be ablated. In one embodiment, the surface portion of the source substrate 301 can comprise silicon nitride, the laser wavelength of the laser beam can be an ultraviolet wavelength (such as 248 nm or 193 nm), and irradiating the surface portions with the laser beam ablates the surface portions. Preferably the peak wavelength of the beam from laser 377 is longer than the peak wavelength of the beam from laser 477.

Referring to FIG. 11D, the remaining portions of the source coupon, i.e., the assembly of the source substrate 301 and devices 10 that remain attached to the source substrate 301, are separated from the assembly of the target substrate 400 and the devices 10 bonded thereto through respective bonded solder material portions 16.

Referring to FIG. 11E, at least one of the target substrate 400 and the transferred subset of the devices 10 can be pushed against each other while performing an additional reheating and reflow of solder material portions (i.e., the bonded solder material portions 16) that are present on the target substrate 400. For example, the top surfaces of the bonded devices 10 may be pushed toward the target substrate 400 employing a planar substrate or press die 700 having a horizontal bottom surface, which can contact the top surfaces of the transferred devices 10.

Optionally, the re-heating process can induce reflow of the remaining second bonding structures 14 which are not bonded to devices 10. The unbounded structures 14 may melt and reflow to develop convex surface profiles. The reflowed and re-solidified second bonding structures 14 may have a greater thickness (i.e., height) at a center portions thereof than the second bonding structures 14 prior to the reflow, such as at least 50%, for example 50-100% greater thickness (i.e., height). The reflowed and re-solidified second bonding structures 14 preferably also have a greater thickness (i.e., height) at a center portions thereof than the bonded material structures 16 which are bonded to the devices 10, such as at least 50%, for example 50-100% greater thickness (i.e., height). The reflow temperature may be slightly higher than the melting temperature of the bonding structure, for example 15 to 20° C. higher than the melting temperature of the bonding structure. Thus, for tin bonding material structures 14 having a melting temperature of about 232° C., the reflow temperature may be 245 to 255° C. The reflow may be conducted in a reflow oven in an inert or reducing ambient (i.e., in a non-oxidizing ambient). Alternatively, the reflow may be conducted in air if an anti-oxidation flux is used during reflow.

Referring to FIG. 11F, an additional source coupon including an additional source substrate 301' and additional devices 10' can be provided. The additional devices 10' can be positioned with some vacancies such that the additional devices 10' do not collide with the devices 10 that are present on the target substrate 400. Additional first bonding structures 12 can be provided on the additional devices 10'.

Figure 11H:
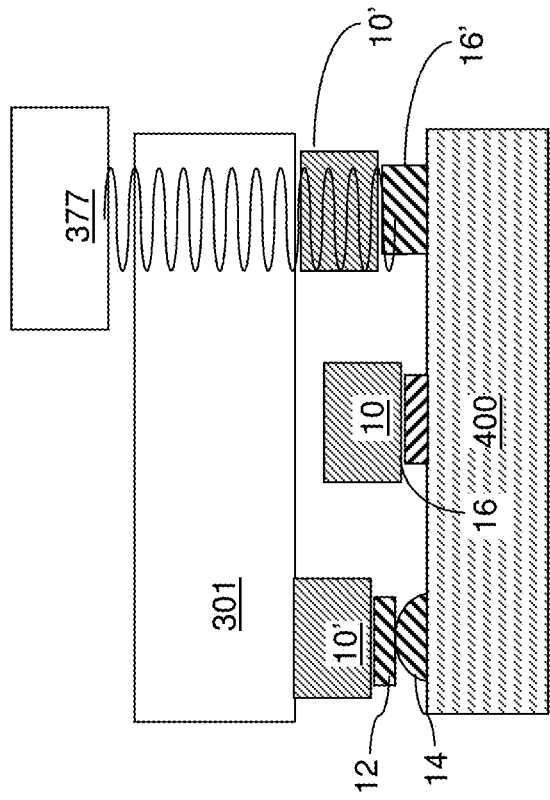
Figure 11G:
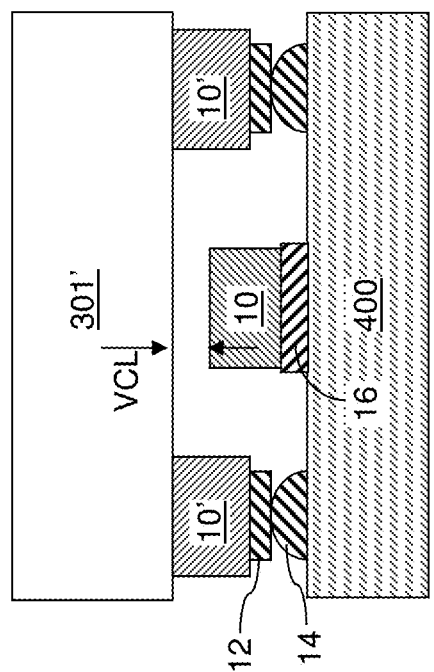

Referring to FIG. 11G, the first bonding structures 12 on the additional source coupon (301', 10') can be brought into physical contact with the second bonding structures 14 on the target substrate 400. Because the thickness of the bonded solder material portions 16 is less than the sum of the thicknesses of a stack of a first bonding structures 12 and a second bonding structure 14, a vertical clearance VCL can be provided between the bottom surface of the additional source substrate 301' and the top surfaces of the devices 10 that are already bonded to the target substrate 400. Subsequently, the processing steps of FIGS. 11B-11D can be performed to transfer a subset of the additional devices 10' to the target substrate 400. The processing step of FIG. 11E can be performed again such that the top surfaces of all bonded devices (10, 10') can be coplanar, i.e., within a same horizontal plane.

The processing steps of FIGS. 11F and 11G and the processing step of FIG. 11E can be repeated with more source coupons having different types of devices to transfer more devices to the target substrate 400, as shown in FIG. 11H.

Thus, in one embodiment, the method of FIGS. 7, 8, 9, 10 and 11A-11H includes providing a supply coupon comprising a combination of a source substrate 301 and devices 10 thereupon, providing a target substrate 400 that includes bonding sites and forming first bonding material portions 12' on one of surfaces of the devices 10 (or alternatively on surfaces of the bonding sites of the target substrate 400), and coining the first bonding material portions 12' to form first bonding material pads 12 having a flatter bonding surface than that of the first bonding material portions 12', as shown in FIGS. 8 and 9.

The method further includes bonding a first set (e.g., including the middle pad 12 in FIG. 11B) of the first bonding material pads 12 with respective bonding structures 14 to form a first set of bonded material portions 16, as shown in FIG. 11B. The first set of the first bonding material pads 12 is located on a first set of devices (e.g., including the middle device 10 in FIG. 11B, or alternatively on the first set of bonding sites of the target substrate 400), and the bonding structures 14 are located on the first set (e.g., the middle bonding site in FIG. 11B) of the bonding sites of the target substrate 400 (or alternatively on the first set of devices). The method further includes detaching the first set of devices (e.g., the middle device 10 in FIGS. 11C and 11D) from the source substrate 301, such that the first set of the devices 10 is bonded to the bonding sites of the target substrate 400 by the first set of bonded material portions 16, while a remaining second set of devices 10 (e.g., the left and right devices 10 in FIG. 11D) remains on the source substrate 301.

As shown in FIG. 11A, the bonding structures 14 preferably comprise second bonding material pads 14 and as described above, the devices 10 comprise LEDs. As shown in FIGS. 8 and 9, the second bonding material pads 14 may be formed by forming second bonding material portions 14' on the other one of surfaces of the devices 10 or surfaces of the bonding sites of the target substrate 400, and coining the second bonding material portions 14' to form the second bonding material pads 14 having a flatter bonding surface than that of the second bonding material portions 14. Preferably, coining the first bonding material portions 12' and coining the second bonding material portions 14' comprises pressing the first bonding material portions against the second bonding material portions at an elevated temperature.

In another embodiment, a method comprises reflowing a second set of bonding pads 14 on a second set of the bonding sites that are not bonded to the devices 10 to increase a thickness of the second set of the bonding pads 14 without increasing a thickness of the first set of bonded material portions 16, as shown in FIG. 11E. The method further includes providing a second supply coupon comprising a combination of a second source substrate 301' and third and fourth sets of devices 10' thereupon, as shown in FIG. 11F. This step is followed by bonding the third set of devices 10' (e.g., the right side device in FIG. 11H) to the second set of bonding pads 14 (e.g., the right side pad in FIG. 11H) on the second set of the bonding sites on the target substrate 400 such that a clearance space VCL exists between the second source substrate 301' and the first set of devices 10. The bonding may be carried out by laser irradiation from the laser 377 similar to that shown in FIG. 11B to form a second bonded material portion 16' between the devices 10' and pads 14. The method also includes detaching the third set of devices 10' (e.g., the right side device in FIG. 11H) from the second source substrate 301', wherein the third set of the devices 10' is bonded to the target substrate 400, while the fourth set of devices 10' (e.g., the left device 10' in FIG. 11H) remains on the second source substrate 301', similar to the step shown in FIG. 11F.

Figure 12A:
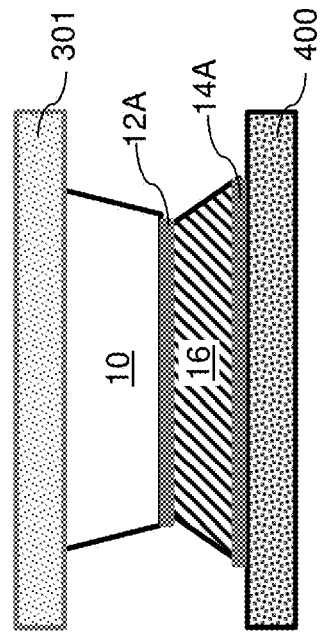
FIGS. 12A and 12B are sequential vertical cross-sectional views of a target substrate, a transferred device, and bonding structures therebetween during a first exemplary bonding process according to an embodiment of the present disclosure.
Figure 12B:
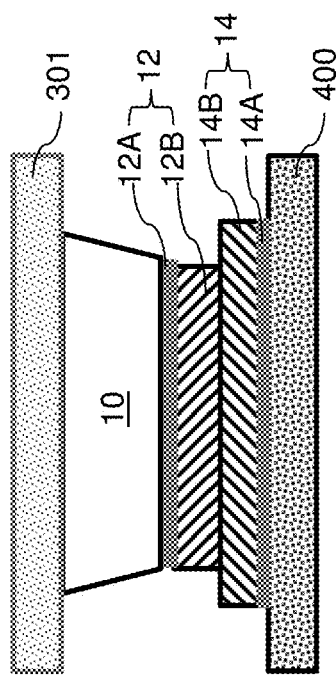

Referring to FIGS. 12A and 12B, a first exemplary bonding process is illustrated, which may be employed at the processing steps of FIGS. 11A and 11B.

Referring to FIG. 12A, first bonding structures 12 can be formed on a set of surfaces of the devices 10. Each of the first bonding structures 12 comprises a first wetting layer 12A having a first lateral dimension (e.g., a first width which in FIG. 12A is the horizontal direction which is parallel to the surface of the device 10 which faces the substrate 400 during bonding), and a first solder material pad 12B having a lateral dimension that is the same as the first lateral dimension facing substrate 400. In one embodiment, a vertically stacked pair of a first wetting layer 12A and a first solder material pad 12B can have the same area. The first solder material pad 12B can be a coined portion of a solder material. Second bonding structures 14 can be formed on a set of surfaces of the bonding sites of the target substrate 400. Each of the second bonding structures 14 comprises a second wetting layer 14A having a second lateral dimension (e.g., a second width which in FIG. 12A is the horizontal direction which is parallel to the surface of the substrate 400 which faces the device 10 during bonding) that is greater than the first lateral dimension, and a second solder material pad 14B having a lateral dimension that is the same as the second lateral dimension. In one embodiment, a vertically stacked pair of a second wetting layer 14A and a second solder material pad 14B can have the same area facing the device 10. In one embodiment, the second lateral dimension can be greater than the first lateral dimension.

The first bonding structures 12 and the second bonding structures 14 can be brought into physical contact to form vertical stacks of a first bonding structure 12 and a second bonding structure 14 having a face-to-face contact at a planar interface. In FIG. 12A, the vertical direction is perpendicular to the surfaces of the device 10 and substrate 400 which face each other. Each adjoining pair of a first bonding structure 12 and a second bonding structure 14 includes at least one solder material portion such as a first solder material pad 12B and a second solder material pad 14B. The first solder material pad 12B and a second solder material pad 14B may include any suitable bonding material, such as tin, indium, tellurium, and alloys thereof. The wetting layers 12A and 14A may comprise any suitable wetting material, such as gold, nickel or platinum. Optionally, the wetting layers may also contain additional barrier metal sublayers, such as titanium or tungsten sublayers. Preferably, the wetting layers are thinner than the pads.

Referring to FIG. 12B, a subset of adjoining pairs of a first bonding structure 12B and a second bonding structure 14B can be bonded by reflowing respective solder material portions (12B, 14B). A solder material portion 16 having a trapezoidal vertical cross-sectional profile (i.e., thickness cross section between device 10 and substrate 400) is formed between the target substrate 400 and each bonded device 10 after the reflowed solder material portions re-solidify. A subset of the devices 10 is bonded to a subset of the bonding sites of the target substrate 400. The solder (i.e., bonded) material portion 16 has a lower total height (i.e., thickness) than the sum of the heights of the starting bonding structures 12 and 14. Thus, the starting bonding structures 12 and 14 may have a non-trapezoidal vertical cross sectional profile (i.e., shape), such as a rectangular vertical cross sectional profile. After the bonding step, the resulting bonded material portion 16 has trapezoidal vertical cross-sectional profile (i.e., shape).

In one embodiment, the trapezoidal vertical cross-sectional profile can be formed by a self-aligning wetting process in which a first periphery of each reflowed solder material portion 16 is aligned to a periphery of a respective first wetting layer 12A and a second periphery of each reflowed solder material portion 16 is aligned to a periphery of a respective second wetting layer 14B by surface tension during a respective reflow process. The reflow process may be performed by an anneal process that is performed in a furnace, or can be performed site by site, for example, by laser irradiation. Optionally, the target substrate 400 and the bonded devices 10 can be pushed against each other during the respective reflow process at the processing step of FIG. 12B, or at a processing step corresponding to the step of FIG. 11E.

Figure 13A:
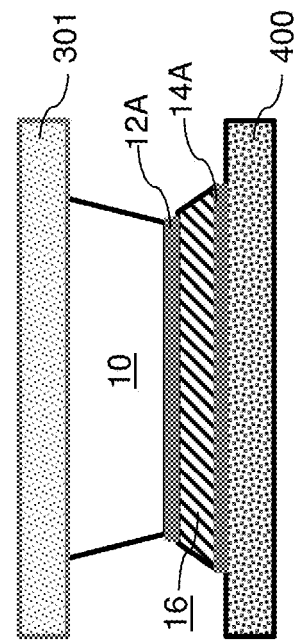
FIGS. 13A and 13B are sequential vertical cross-sectional views of a target substrate, a transferred device, and bonding structures therebetween during a second exemplary bonding process according to an embodiment of the present disclosure.
Figure 13B:
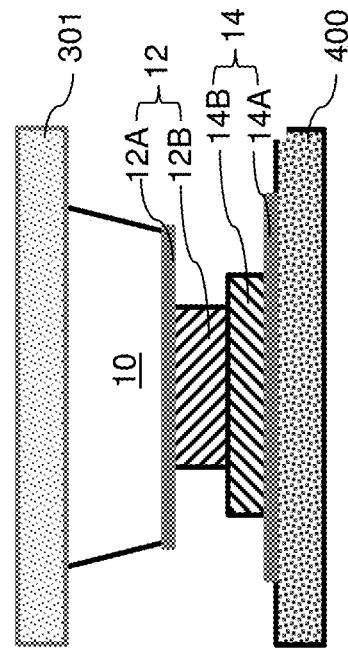

Referring to FIGS. 13A and 13B, a second exemplary bonding process is illustrated, which may be employed at the processing steps of FIGS. 11A and 11B.

Referring to FIG. 13A, first bonding structures 12 can be formed on a set of surfaces of the devices 10. Each of the first bonding structures 12 comprises a first wetting layer 12A having a first lateral dimension (e.g., a first width), and a first solder material pad 12B having a lesser lateral extent (i.e., smaller second lateral dimension or width) than the first lateral dimension. The first solder material pad 12B can be a coined portion of a solder material. Second bonding structures 14 can be formed on a set of surfaces of the bonding sites of the target substrate 400. Each of the second bonding structures 14 comprises a second wetting layer 14A having a third lateral dimension (e.g., a third width) that is greater than the first lateral dimension, and a second solder material pad 14B having a lesser lateral extent (i.e., smaller fourth lateral dimension or width) than the third lateral dimension. In one embodiment, the third lateral dimension can be greater than the first lateral dimension, which can be greater than the fourth lateral dimension, which can be greater than the second lateral dimension).

Referring to FIG. 13B, a subset of adjoining pairs of a first bonding structure 12B and a second bonding structure 14B can be bonded by reflowing respective solder material portions (12B, 14B). A solder material portion 16 having a trapezoidal vertical cross-sectional profile is formed between the target substrate 400 and each bonded device 10 after the reflowed solder material portions re-solidify. A subset of the devices 10 is bonded to a subset of the bonding sites of the target substrate 400. The same materials may be used as in the prior embodiment.

In one embodiment, the trapezoidal vertical cross-sectional profile can be formed by a self-aligning wetting process in which a first periphery of each reflowed solder material portion 16 is aligned to a periphery of a respective first wetting layer 12A and a second periphery of each reflowed solder material portion 16 is aligned to a periphery of a respective second wetting layer 14B by surface tension during a respective reflow process. The reflow process may be performed by an anneal process that is performed in a furnace, or can be performed site by site, for example, by laser irradiation. Optionally, the target substrate 400 and the bonded devices 10 can be pushed against each other during the respective reflow process at the processing step of FIG. 12B, or at a processing step corresponding to the step of FIG. 11E. In this embodiment, an even larger height reduction of portion 16 compared to the height of the original portions 12B and 14B may be obtained to facilitate the bonding steps shown in FIGS. 11E and 11F.

Referring to FIGS. 14A and 14B, a third exemplary bonding process is illustrated, which may be employed at the processing steps of FIGS. 11A and 11B.

Referring to FIG. 14A, first bonding structures 12 can be formed on a set of surfaces of the devices 10. The first bonding structures 12 can include a coined portion of a solder material, and can have a first lateral dimension. Second bonding structures 14 can be formed on a set of surfaces of the bonding sites of the target substrate 400. Each of the second bonding structures 14 comprises a metallic material, and can have a second lateral dimension. In one embodiment, the second lateral dimension can be greater than the first lateral dimension.

In one embodiment, each adjoining pair of the first bonding structure 12 and the second bonding structure 14 comprises two different metallic materials. In one embodiment, the at least one solder material portion that is provided within each adjoining pair of the first bonding structure 12 and the second bonding structure 14 can be a portion of a first metallic material having a lower melting temperature among the two different metallic materials. The portions of the first metallic material (e.g., of structure 12) has a first uniform height (i.e., thickness), t1, prior to reflowing of the solder material portions.

Referring to FIG. 14B, the processing step of FIG. 11B can be performed to reflow a solder material portion in each selected stack of a first bonding structure 12 and a second bonding structure 14. In one embodiment, at a first stage of reflowing, one or both solder material portions (12, 14) can develop a convex surface profile having a maximum height t2 that is greater than the first uniform height. In one embodiment, the distance between the source substrate 301 and the target substrate 400 can be increased, or can remain the same, during the first stage of reflowing. In one embodiment, a second metallic material having a higher melting temperature among the two different metallic materials is not reflowed during the reflow of the solder material portions, i.e., the first metallic material having a lower melting point. For example, structure 12 may be reflowed while structure 14 is not reflowed (or vise versa depending on the materials of the structures). For example, structure 12 may be formed of a lower melting temperature solder material, such as tin, while structure 14 may be formed of a higher melting temperature solder material, such as indium, tellurium or a gold-tin alloy. The reflow temperature may be higher than the melting temperature of the material of structure 12 but lower than the melting temperature of structure 14 to reflow only structure 12 but not structure 14.

Referring to FIG. 14C, the distance between the source substrate 301 and the target substrate 400 can be reduced during a second stage of the reflow process, or at a subsequent processing step that corresponds to the processing step of FIG. 11E (i.e., pressing the substrates 301 and 400 together). In this case, each solder material portion can develop a trapezoidal vertical cross-sectional profile while the distance between the target substrate 400 and an overlying or underlying device 10 is decreased. The height t3 of resulting layer 12 is smaller than heights t1 and t2.

In one embodiment, additional devices can be bonded to the target substrate after transfer of the functional devices 10 to the target substrate, for example, by repeatedly applying the processing steps of FIGS. 11F, 11G, and 11E with different devices. In one embodiment, a combinations of target substrate 400 and transferred devices thereupon can constitute an emissive display panel containing light emitting diodes that emit three or more different colors. In one embodiment, the emissive display panel comprises a direct view display panel containing red, green, and blue wavelength light emitting diodes and sensors bonded to the target substrate.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A method of transferring devices to a target substrate, comprising:
   providing a supply coupon comprising a combination of a source substrate and devices thereupon;
   providing a target substrate that includes bonding sites;
   forming first bonding material portions on one of surfaces of the devices or surfaces of the bonding sites of the target substrate;
   coining the first bonding material portions to form first bonding material pads having a flatter bonding surface than that of the first bonding material portions;
   bonding a first set of the first bonding material pads with respective bonding structures to form a first set of bonded material portions, wherein the first set of the first bonding material pads is located on one of a first set of devices or the first set of bonding sites of the target substrate, and the bonding structures are located on another one of the first set of devices or the first set of the bonding sites of the target substrate, wherein the step of bonding the first set of the first bonding material pads with respective the first set of bonding structures comprises selectively reflowing the first set of the first bonding pads of the first set of devices without reflowing a second set of the first bonding material pads of the second set of devices, and wherein the selective reflowing is performed by irradiating a laser beam on the first set of the first bonding material pads; and
   detaching the first set of devices from the source substrate, wherein the first set of the devices is bonded to the bonding sites of the target substrate by the first set of bonded material portions, while a remaining second set of devices remains on the source substrate.

2. The method of claim 1, wherein the first bonding material portions and the first bonding material pads are formed on the devices.

3. The method of claim 1, wherein the first bonding material portions and the first bonding material pads are formed on the bonding sites of the source substrate.

4. The method of claim 1, wherein the bonding structures comprise second bonding material pads and wherein the devices comprise LEDs.

5. The method of claim 4, further comprising:
   forming second bonding material portions on the other one of surfaces of the devices or surfaces of the bonding sites of the target substrate; and
   coining the second bonding material portions to form the second bonding material pads having a flatter bonding surface than that of the second bonding material portions.

6. The method of claim 5, wherein coining the first bonding material portions and coining the second bonding material portions comprises pressing the first bonding material portions against the second bonding material portions at an elevated temperature.

7. The method of claim 5, further comprising:
   reflowing a second set of bonding pads on a second set of the bonding sites that are not bonded to the devices to increase a thickness of the second set of the bonding pads without increasing a thickness of the first set of bonded material portions;
   providing a second supply coupon comprising a combination of a second source substrate and third and fourth sets of devices thereupon;
   bonding the third set of devices to the second set of bonding pads on the second set of the bonding sites on the target substrate such that a clearance space exists between the second source substrate and the first set of devices; and detaching the third set of devices from the second source substrate, wherein the third set of the devices is bonded to the target substrate, while the fourth set of devices remains on the second source substrate.

8. The method of claim 1, wherein the first set of bonded material portions have a trapezoidal vertical cross-sectional profile.

9. A method of transferring devices to a target substrate, comprising:

providing a target substrate that includes first and second sets of bonding sites, wherein a first set of devices is bonded to the first set of bonding sites by a first set of bonded material portions, and a second set of bonding sites contains a second set of bonding pads that are not bonded to devices;

reflowing the second set of bonding pads to increase their thickness without increasing a thickness of the first set of bonding material portions, wherein bonding the second set of devices to the second set of bonding sites comprises irradiating a laser beam on bonding material pads located between each pair of a device from the second set of devices and a bonding site from the second set of bonding sites;

providing a supply coupon comprising a combination of a source substrate and second and third sets of devices thereupon;

bonding the second set of devices to the second set of bonding sites on the target substrate such that a clearance space exists between the source substrate and the first set of devices; and detaching the second set of devices from the source substrate, wherein the second set of devices is bonded to the second set of bonding sites of the target substrate, while the second set of devices remains on the source substrate.

10. The method of claim 9, further comprising pushing the first set of devices and the target substrate together during the step of reflowing the second set of bonding pads.

11. The method of claim 9, wherein the devices comprise LEDs and wherein reflowing the second set of bonding pads to increase their thickness comprises reflowing the second set of bonding pads to increase their thickness by at least 50%.

12. The method of claim 9, wherein gaps between devices are located on the source substrate which correspond to locations of the first set of devices on the target substrate.

13. A method of transferring devices to a target substrate, comprising:

providing a supply coupon comprising a combination of a source substrate and devices thereupon;

providing a target substrate that includes bonding sites;

forming first bonding structures on a set of surfaces of the devices, each of the first bonding structures comprising a first wetting layer having a first lateral dimension;

forming second bonding structures on a set of surfaces of the bonding sites of the target substrate, each of the second bonding structures comprising a second wetting layer having a second lateral dimension that is greater than the first lateral dimension;

bringing the first bonding structures and the second bonding structures into physical contact, wherein each adjoining pair of a first bonding structure and a second bonding structure includes at least one bonding material portion; and bonding a subset of adjoining pairs of a first bonding structure and a second bonding structure to form a bonded material portion having a trapezoidal vertical cross-sectional profile, wherein the trapezoidal vertical cross-sectional profile is formed by a self-aligning wetting process in which a first surface of the bonded material portion is aligned to a periphery of first wetting layer and an opposite second surface of the bonded material portion is aligned to a periphery of the second wetting layer, and wherein the bonding is performed by reflowing the at least one bonding material portion by irradiating the at least one bonding material portion with laser radiation.

14. The method of claim 13, wherein:

each adjoining pair of the first bonding structure and the second bonding structure comprises first and second bonding material portions having different melting temperatures; and during the step of bonding, the first bonding material portion having a lower melting temperature is reflowed while the second bonding material portion having a higher melting temperature is not reflowed, followed by pressing the first and the second bonding material portions together to form the bonded material portion having the trapezoidal vertical cross-sectional profile.

15. The method of claim 13, wherein:

the first bonding structure contains a first bonding material portion and the second bonding structure contains a second bonding material portion;

the second bonding material portion has a larger width than the first bonding material portion;

the first bonding material portion has a smaller width than the first wetting layer; and the second bonding material portion has a smaller width than the second wetting layer.

* * * * *